(12) United States Patent
Ogashiwa et al.

(10) Patent No.: US 8,962,471 B2
(45) Date of Patent: Feb. 24, 2015

(54) BUMP, METHOD FOR FORMING THE BUMP, AND METHOD FOR MOUNTING SUBSTRATE HAVING THE BUMP THEREON

(71) Applicants: Toshinori Ogashiwa, Kanagawa (JP); Masayuki Miyairi, Kanagawa (JP)

(72) Inventors: Toshinori Ogashiwa, Kanagawa (JP); Masayuki Miyairi, Kanagawa (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 13/912,826

(22) Filed: Jun. 7, 2013

(65) Prior Publication Data

US 2014/0295619 A1 Oct. 2, 2014

Related U.S. Application Data

(62) Division of application No. 13/144,411, filed as application No. PCT/JP2010/053615 on Mar. 5, 2010, now Pat. No. 8,492,894.

(30) Foreign Application Priority Data

Mar. 6, 2009 (JP) ................................ P2009-053085

(51) Int. Cl.
*H01L 21/00* (2006.01)
*H01L 21/44* (2006.01)
*H01L 23/00* (2006.01)

(52) U.S. Cl.
CPC ................ *H01L 24/11* (2013.01); *H01L 24/13* (2013.01); *H01L 24/81* (2013.01); *H01L 24/17* (2013.01); *H01L 2224/11442* (2013.01); *H01L 2224/1146* (2013.01); *H01L 2224/1147* (2013.01); *H01L 2224/11505* (2013.01); *H01L 2224/11902* (2013.01); *H01L 2224/13017* (2013.01); *H01L 2224/1308* (2013.01); *H01L 2224/13082* (2013.01); *H01L 2224/13139* (2013.01); *H01L 2224/13144* (2013.01); *H01L 2224/13147* (2013.01); *H01L 2224/13155* (2013.01);

(Continued)

(58) Field of Classification Search
USPC ............ 438/612–617; 257/E23.021, E23.069
See application file for complete search history.

(56) References Cited

U.S. PATENT DOCUMENTS 5,053,851 A * 10/1991 Berndlmaier et al. ........ 257/786
5,641,996 A * 6/1997 Omoya et al. ................ 257/787

(Continued)

FOREIGN PATENT DOCUMENTS

| JP | 1-191452 | 8/1989 |
| JP | 7-22465 | 1/1995 |
| JP | 2004-31177 | 1/2004 |
| JP | 2005-136375 | 5/2005 |
| JP | 2005-216508 | 8/2005 |

*Primary Examiner* — Jasmine Clark
(74) *Attorney, Agent, or Firm* — Roberts & Roberts, LLP

(57) ABSTRACT

A two-layer structure bump including a first bump layer of a bulk body of a first conductive metal, which is any of gold, copper, and nickel, formed on a substrate and a second bump layer of a sintered body of a powder of a second conductive metal, which is any of gold and silver, formed on the first bump layer. The bulk body composing the first bump layer is formed through any of plating, sputtering, or CVD. The sintered body composing the second bump layer is formed by sintering the powder of the second conductive metal having a purity of not lower than 99.9 wt % and an average particle diameter of 0.005 μm to 1.0 μm. The second bump layer has a Young's modulus 0.1 to 0.4 times that of the first bump layer.

20 Claims, 3 Drawing Sheets

(52) U.S. Cl.
CPC .......... *H01L2224/81097* (2013.01); *H01L 2224/81203* (2013.01); *H01L 2224/81205* (2013.01); *H01L 2224/81207* (2013.01); *H01L 2224/8121* (2013.01); *H01L 2924/01004* (2013.01); *H01L 2924/01022* (2013.01); *H01L 2924/01027* (2013.01); *H01L 2924/01029* (2013.01); *H01L 2924/01033* (2013.01); *H01L 2924/01046* (2013.01); *H01L 2924/01047* (2013.01); *H01L 2924/01057* (2013.01); *H01L 2924/01078* (2013.01); *H01L 2924/01079* (2013.01); *H01L 2924/00013* (2013.01); *H01L 2924/01006* (2013.01); *H01L 2924/01024* (2013.01); *H01L 2224/11332* (2013.01); *H01L 2924/01103* (2013.01); *H01L 2924/01108* (2013.01); *H01L 2924/01203* (2013.01)

USPC .......... 438/613; 438/612; 438/614; 438/615; 257/E23.021; 257/E23.069

(56) References Cited

U.S. PATENT DOCUMENTS

| | | | |
|---|---|---|---|
| 7,269,439 | B2 | 9/2007 | Honda |
| 7,528,487 | B2 | 5/2009 | Imai |
| 2003/0030149 | A1 | 2/2003 | Miura et al. |
| 2004/0002356 | A1 | 1/2004 | Honda |
| 2006/0267218 | A1 | 11/2006 | Hozoji et al. |
| 2007/0216012 | A1 | 9/2007 | Hozoji et al. |

* cited by examiner

BUMP, METHOD FOR FORMING THE BUMP, AND METHOD FOR MOUNTING SUBSTRATE HAVING THE BUMP THEREON

CROSS REFERENCE TO RELATED APPLICATION

This application is a division of U.S. patent application Ser. No. 13/144,411, filed Jul. 13, 2011, now U.S. Pat. No. 8,492,894, as a National Phase entry of International Application No. PCT/JP2010/053615, having International Filing Date: Mar. 5, 2010, and claims priority of Japanese patent application P2009-053085 filed Mar. 6, 2009, all of which are incorporated herein by reference.

FIELD OF THE INVENTION

The present invention relates to bumps formed on a semiconductor chip or the like and a method for forming the bumps. More particularly, the present invention relates to bumps produced from a metal paste, of which the flatness is compensable without requiring excessive pressure during mounting.

DESCRIPTION OF THE RELATED ART

Due to the recent high integration of semiconductor circuits, chip on board (COB) or chip on chip (COC) or the like tends to be employed as the structure thereof, using a flip chip method for mounting in many instances. In mounting by a flip chip method, an electrode (bump) formed on a substrate is directly bonded to a circuit substrate. The method for forming the bump is usually performed by plating.

The plating method enables producing a dense electrode with stability and control of the film thickness (bump height) or formation of a fine pattern is achieved with a proper condition setting. Nevertheless, since it is difficult to form a thoroughly uniform film thickness with any adjustment of the condition setting, some slight variations in the bump height are unavoidable. The variations in the bump height cause a bump with a loose connection when mounted.

Although pressure is applied to all the bumps for close contact during mounting as a countermeasure against the variations in the bump height, excessive pressure causes strain remaining in the bumps, possibly resulting in breakage due to expansion and contraction caused by heat cycles accompanied with the use of the semiconductor circuit. The excessive pressure itself may cause breakage of the substrate in the first place.

In order to eliminate the variations, grinding and polishing of the plated bumps has been proposed. For example, Patent Document 1 discloses a method for planarizing bumps by coating the surface of a substrate having bumps thereon with resin and then grinding the coated surface until the bumps come to the surface. The method enables ensuring stable conductivity and mounting with low pressure that eliminates any fear of residual strain in the bumps.

The applicant of the present invention has proposed a method for solving the problem associated with plated bumps from a viewpoint different from the above (Patent Document 2). In the method, the bumps are formed by sintering metal powder having a predetermined particle size and purity with an alternative composition. The bump of a sintered body is more porous, relatively soft, and more elastic than that of the dense bulk metal formed by plating. The elasticity of the bumps enables bonding at a constant height even with variations in bump height, because contraction occurs corresponding to difference in height. Since no strain remains in the bumps, the possibility of breakage due to expansion and contraction is low.

PRIOR ART DOCUMENTS

Patent Documents

Patent Document 1
  Japanese Patent Application Laid-Open No. 2004-31177
Patent Document 2
  Japanese Patent Application Laid-Open No. 2005-216508

SUMMARY OF THE INVENTION

Problems to be Solved by the Invention

In the planarization of the bumps by grinding and polishing, however, ground fine powder may attach to neighboring bumps, resulting in short-circuiting the bumps. Moreover, a CMP polisher raises an equipment cost problem.

In contrast, while the use of bumps of a sintered body causes no problem described above, the elasticity of the bumps may cause lateral deformation during mounting, resulting in impaired spacing (pitch) of the bumps.

It is an object of the present invention, in the light of these circumstances, to provide bumps on a substrate used in a flip chip method for eliminating problems associated with variations in bump height and a method for mounting the substrate having the bumps thereon.

Means for Solving the Problems

Through extensive research for solving the problems, the present inventors have devised a two-layer structure including a bulk metal layer for ensuring rigidity of the bump and a sintered layer for absorbing variations in bump height as a new structure of a bump. The present invention provides a bump of a conductive metal formed in a predetermined pattern on a substrate, comprising a two-layer structure of a first bump layer of a bulk body of a first conductive metal, which is any of gold, copper, and nickel, formed on the substrate and a second bump layer of a sintered body of a powder of a second conductive metal, which is any of gold and silver, formed on the first bump layer; the bulk body composing the first bump layer being formed by any of plating, sputtering, and CVD; the sintered body composing the second bump layer being formed by sintering a powder of the second conductive metal having a purity of not lower than 99.9 wt % and an average particle diameter of 0.005 µm to 1.0 µm; the second bump layer having a Young's modulus 0.1 to 0.4 times that of the first bump layer.

In the present invention, while a bulk metal composes a main part of the bump, a sintered body is disposed at the forefront of the bump with consideration for the elasticity of the bump of the sintered body that was disclosed by the present applicant as described above. Since the rigidity of the bump of the present invention is secured with the first bump layer, lateral deformation of the bump during flip chip bonding is controlled to keep the pitch. The elasticity of the upper second bump layer enables deformation corresponding to the variations in bump height, resulting in bonding with excellent flatness under low pressure.

The first bump layer of dense bulk metal having rigidity is formed by any of plating, sputtering, and CVD.

In contrast, the second bump layer of the sintered body formed on the first bump layer is formed with sintering powder of the second conductive metal having a purity of not lower than 99.9 wt % and an average particle diameter of 0.005 µm to 1.0 µm. The metal powder is required to have a high purity of not lower than 99.9 wt %, because low purity causes an increase in hardness of the powder, resulting in reduction in plastic deformability and elasticity. Regarding the average particle diameter of the metal powder, a particle diameter larger than 1.0 µm causes difficulty in sintering and the lower limit of 0.005 µm is defined with consideration for handling the powder.

The second bump layer is required to have a Young's modulus lower than that of the first bump layer. Since the second bump layer softer than the first layer is disposed in the upper part, stable bonding corresponding to the variations in bump height is achieved. More specifically, the second bump layer has a Young's modulus 0.1 to 0.4 times that of the first bump layer. The reason is that with less than 0.1 times the excessively soft second bump layer significantly deforms during bonding to cause a possible problem in the bump shape, while with more than 0.4 times the first bump layer may be deformed.

The first and second conductive metals composing the first and second bump layers are required to have conductivity as electrodes respectively and furthermore required to have a combination of metals so that each of the bulk body and the sintered body has a Young's modulus to satisfy the ratio requirement described above. From these view points, the first conductive metal is selected from any of gold, copper, and nickel. On the other hand, the second conductive metal is selected from any of gold and silver.

As described above, the same metal (gold) may be selected as the first and second conductive metals. Accordingly, the first bump layer may be a gold plated layer, and the second bump layer may be formed of sintered gold powder on the first bump layer. Alternatively, the first conductive metal and the second conductive metal may be different kinds of metal. For example, the first bump layer may be a nickel or copper plated layer, and the second bump layer may be formed of sintered gold powder on the first bump layer. Selecting different kinds of metal enables reduction in usage of precious metal such as gold, resulting in substrate cost reduction.

Preferably the first bump layer has a height ratio of 0.1 to 0.9 based on the entire bump to secure the rigidity of the bump and to make effective use of the second bump layer. More preferably the first bump layer has a height ratio of 0.5 to 0.9 based on the entire bump.

In the case that the bump layers are each formed of a metal dissimilar to each other, preferably at least one bulk intermediate layer is disposed between the first bump layer and the second bump layer for enhancing adhesion of the both layers. The reduction in adhesion (peeling of both bump layers), which may be caused by the dissimilar metal bonding, is controlled thereby. For example, the first bump layer is formed of a copper plated layer, an intermediate layer is formed by gold plating thereon, and the second bump layer is then formed by sintering gold powder. Preferably the bulk intermediate layer is formed by plating (electrolytic plating or nonelectrolytic plating), sputtering, CVD, or the like. The metal composing the intermediate layer is required to be a conductive metal, preferably gold, silver, platinum, palladium, titanium, chromium, copper, or nickel.

In order to further enhance adhesion, multilayered intermediate layers may be formed and the multilayered intermediate layers may be formed of multiple kinds of metal. Preferably at least the surface of the intermediate layer in contact with the second bump layer is formed of the same conductive metal as the second conductive metal. Accordingly, it is preferred that the entire single-layered intermediate layer be composed of the second conductive metal, while the multilayered intermediate layers have an uppermost layer composed of the second conductive metal. Preferably the intermediate layer or layers have a total thickness of 5 nm to 1000 nm. Since the intermediate layer or layers are formed for securing adhesion, a substantial thickness is not required.

The method for producing bumps of the present invention includes the steps of forming a first bump layer on a substrate by any of plating, sputtering, and CVD; and forming a second bump layer by applying a metal paste containing a powder of a second conductive metal having a purity of not lower than 99.9 wt % and an average particle diameter of 0.005 µm to 1.0 µm on the first bump layer, drying the metal paste, and then heating the metal paste at a temperature of 70° C. to 320° C. for sintering.

Conditions of plating, sputtering, or CVD for forming the first bump layer are not specifically limited. The conditions and processes commonly used in these methods for forming bumps may be employed.

In contrast, metal paste used for forming the second bump layer is a slurry in which metal powder having the characteristics described above has been dispersed in a proper dispersion medium. The metal paste is used for securing handling of the metal powder. The metal powder (the second conductive metal) in the metal paste has a purity of not lower than 99.9 wt % and an average particle diameter of 0.005 µm to 1.0 µm as described above.

Organic solvent is usually used as the dispersion medium for dispersing the metal powder. Examples of the organic solvent include ester alcohol, terpineol, pine oil, butylcarbitolacetate, butylcarbitol, and carbitol. A typical example of the preferred ester alcohol as organic solvent is 2,2,4-trimethyl-3-hydroxypentaisobutylate ($C_{12}H_{24}O_3$). These solvents enable drying at comparatively low temperature.

The metal paste may contain at least one additive selected from an acryl resin, a cellulosic resin, and an alkyd resin. When such a resin is further added to the metal paste, aggregation of the metal powder is prevented and higher homogeneity is achieved. A typical example of the acryl resin is a methyl methacrylate polymer, a typical example of the cellulose resin is ethyl cellulose, and a typical example of the alkyd resin is a phthalic anhydride resin. In particular, ethyl cellulose is most preferred.

The method for applying the metal paste to a substrate may be selected from various methods such as spin coating, screen printing, ink jetting, and spreading the instilled paste with a spatula, corresponding to the size and the pattern of the intended bump.

The applied metal paste is dried in order to remove the organic solvent in the paste. It is preferable to perform the drying at temperature ranging from −20° C. to 5° C. The atmosphere for the drying step may be under reduced pressure. Moisture in the atmosphere is thereby prevented from dew condensation on the surface of the metal powder during the drying step. Preferably the atmosphere under reduced pressure has a degree of vacuum of not higher than 100 Pa, more preferably not higher than 10 Pa, which is determined corresponding to the volatility of the organic solvent in the metal paste.

The metal paste is dried and then sintered to form a sintered body having adjacency structure with mutual point contacts among metal particles in the paste and between the surface of the first bump layer and the metal particles. The sintering temperature is in a range from 70° C. to 320° C., depending on the kind of metal composing the first bump layer (the first conductive metal). Since a temperature lower than 70° C.

causes insufficient sintering, the resulting bumps are unusable. Even though the bump of the present invention is required to have a predetermined ratio of Young's moduli between the first bump layer and the second bump layer, a temperature lower than the lower limit produces an excessively soft second bump layer without achieving the proper ratio of Young's moduli, causing a problem in bump shape due to significant deformation of the second bump layer during bonding. In contrast, a temperature higher than the higher limit produces an excessively hard second bump layer without achieving the proper ratio of Young's moduli, resulting in a possible deformation of the first bump layer during bonding. Corresponding to the metal of the first bump layer, the sintering temperature is specifically in a range from 70° C. to 300° C. for the first bump layer of gold, 80° C. to 300° C. for copper, or 90° C. to 320° C. for nickel. The sintering temperature is adjusted corresponding to the metal of the first bump layer, because each of the bulk metals has a different Young's modulus. Preferably the heating time for sintering is 10 min to 60 min. While sufficient sintering is not achieved for a short time due to unstable temperature of the sintering furnace, productivity declines with an excessively long time. Preferably the sintering is performed under no pressure.

Prior to forming the first and second bump layers, a photoresist pattern may be formed. A photoresist is usually used for forming a micro pattern. When a bump pattern is formed with such a resist, multiple sintering steps may be used. For example, after metal paste is fed into holes (pattern) fabricated by exposure and then sintered at relatively low temperature (80° C. to 100° C.), the resist may be peeled off for sintering once again at relatively high temperature (200° C. to 300° C.). In the two-step sintering, preliminary sintering is performed at low temperature for protecting the resist and finish sintering is performed after removing the resist, resulting in the effective formation of solid bumps.

When a bump having the intermediate layer described above is formed, a step of forming the intermediate layer is included after the first bump layer is formed by plating. Among various methods for forming the intermediate layer, such as plating, sputtering, or CVD, it is preferred to employ plating, nonelectrolytic plating in particular, because a thin film can be produced at low cost.

In a flip chip method using a substrate having the bumps of the present invention, the substrate is mounted on an opposed substrate by bonding the bumps with pressure applied from one or both directions to the substrate while heating at least the second bump layer. The sintered body of the second bump layer in the bump of the present invention is plastically deformed at the region of contact by the pressure and produces bonds between metal atoms at the deformed interface to make a dense junction. The pressure may be applied from one direction or both directions. Preferably the applied pressure is higher than the yield strength of the sintered body for densification of the junction.

During the bonding step, pressure is applied while at least the sintered body is heated. The reason is that since the densification of the junction is not sufficiently achieved without heating, the resulting junction is lacking in strength. The preferred heating temperature is 70° C. to 300° C. The reason is that junction is not achieved at lower than 70° C., while thermal strain during cooling has a large effect at higher than 300° C.

Alternatively, ultrasonic waves may be applied in addition to heating during the bonding step. Heating or a combination of heating and ultrasonic waves enhances plastic deformation of the metal powder and the bond and enables reduction in the heating temperature. Nevertheless, the vibration may cause deformation of an entire bump when the size of the bump is ultrafine. Accordingly, it is preferred that fine bumps formed with a narrow-pitch pattern be bonded through heating alone without applying ultrasonic waves. Preferably ultrasonic waves are applied under conditions with vibration amplitude of 0.5 μm to 5 μm and application time of 0.5 sec to 3 sec. The reason is that an excessive application of ultrasonic waves damages an entire bump.

In the bonding step, the heating and the ultrasonic waves may be applied to at least the sintered body of the second bump layer for meeting the purpose, or may be applied to the entire bump. Heating may be performed by applying pressure in an atmosphere furnace at a predetermined temperature or by heat transfer from a heated stage loaded with the substrate (or opposite substrate) during bonding. The application of ultrasonic waves is readily performed by ultrasonic oscillation also from the stage.

Advantageous Effects of Invention

When the bumps of the present invention are used, circuit implementation by a flip chip method may be achieved without consideration for variations in bump height as described above. On this occasion, the bump can be bonded under low pressure.

DETAILED DESCRIPTION OF THE PREFERRED EMBODIMENTS

Figure 1:
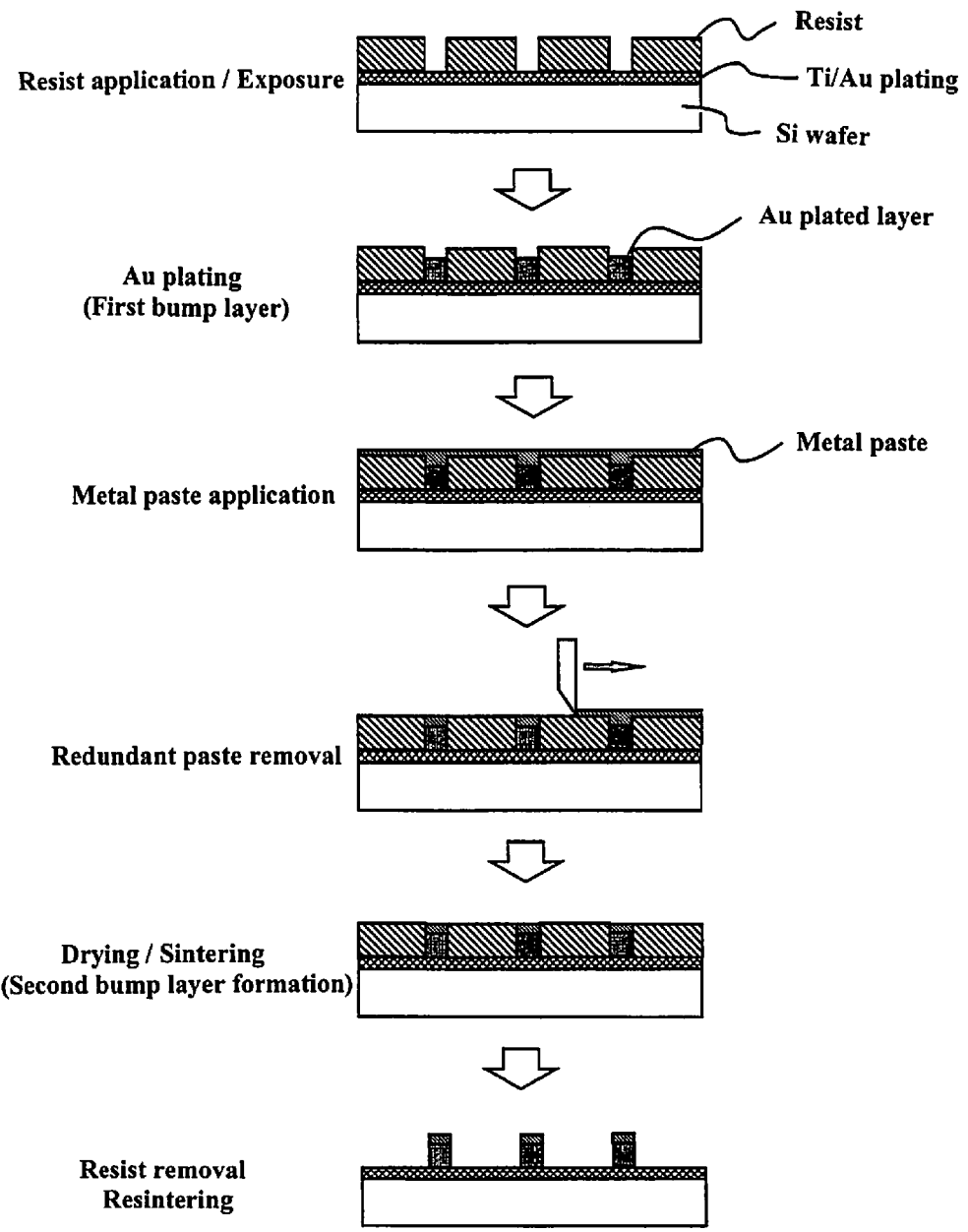
FIG. 1 is a schematic diagram of steps of forming bumps in an embodiment of the present invention.

A preferred embodiment of the bump formation of the present invention is described below. In the present embodiment, the relation between the particle diameter or sintering conditions of metal powder composing a second bump layer and strength of the sintered bump layer was examined. A plurality of metal pastes were produced from metal powder of each metal (gold or silver) as a second conductive metal, each having a different particle diameter for the examination, and were sintered after application for evaluation of the strength. The metal pastes were prepared by blending metal powder with purity of 99.99 wt % having a particle diameter of 0.005 μm, 0.3 μm, 1.0 μm, or 2.0 μm produced through wet reduction method into ester alcohol as organic solvent. The metal pastes were applied to a substrate plated with Si/Au having holes by resist, dried in a vacuum at 5° C., and sintered at a sintering temperature of 230° C. The resist was then removed for measuring Young's modulus. The measurement of Young's modulus was obtained from the slope of the linear portion of stress-strain curve in shearing test of the formed bump. The Young's moduli of the bumps produced from the various kinds of metal pastes are shown in Table 1.

TABLE 1

| Particle | Young's modulus | |
| --- | --- | --- |
| diameter | Au | Ag |
| 0.005 μm | 20 GPa | 22 GPa |
| 0.3 μm | 12 GPa | 13 GPa |
| 1.0 μm | 11 GPa | 12 GPa |
| 2.0 μm | <1 GPa | <1 GPa |

As shown in Table 1, each of the metal powders having a particle diameter of 0.005 μm to 1.0 μm has a relatively steady Young's modulus, while each of the metal powders having a particle diameter of 2.0 μm has a significantly low Young's modulus. Although the bumps actually produced from the metal powder having a particle diameter of 2.0 μm tentatively retained three-dimensional shape, the bumps readily collapsed. The reason is believed that the sintering was insufficient due to an excessively low sintering temperature. In contrast, the metal powder having a particle diameter of 0.005 μm caused no problem in strength after sintering, while sufficient stirring had been required to prevent annoying aggregates in the paste until immediately before use. Considering ease of handling, the paste of metal powder having a particle diameter smaller than this is less likely to be preferred.

The proper range of sintering temperature was then examined. Using the metal pastes of each metal having a particle diameter of 0.3 μm, bumps were formed at a sintering temperature of 60° C. to 340° C. to measure Young's moduli. The steps of forming the bumps and the method for measuring Young's modulus were the same as those described above. The results are shown in Table 2.

TABLE 2

| Sintering | Young's modulus | |
| --- | --- | --- |
| temperature | Au | Ag |
| 60° C. | Not sintered | Not sintered |
| 70° C. | 10 GPa | 8 GPa |
| 80° C. | 11 GPa | 12 GPa |
| 90° C. | 12 GPa | 13 GPa |
| 230° C. | 12 GPa | 17 GPa |
| 300° C. | 25 GPa | 27 GPa |
| 320° C. | 45 GPa | 47 GPa |
| 340° C. | 49 GPa | 52 GPa |

As shown in Table 2, it is believed that a sintered body having practical strength can be produced with a sintering temperature of not lower than 70° C. The reason is believed that sintering proceeded to achieve densification through enhanced necking at a sintering temperature of not lower than 70° C. Sintering did not occur at temperature below 60° C. and the bump crumbed without retaining the shape after the sintering step. Accordingly, sintering at least not lower than 70° C. is required to form bumps having a certain level of strength. Although the strength of the sintered body sharply uprose at higher than 300° C., it is necessary to determine the upper limit of the sintering temperature corresponding to a proper ratio of Young's moduli based on the strength (Young's modulus) of the first bump layer.

After the preliminary tests described above, the bumps having the two-layer structure of the present invention were produced for evaluation. FIG. 1 is a schematic diagram of steps of forming bumps in an embodiment of the present invention. A Ti film (0.5 μm) and a Au film (1.0 μm) were previously formed on a semiconductor wafer of silicon by sputtering. A photoresist film (AZP4903 available from Kayaku MicroChem Corporation) was spin-coated on the surface of the wafer, prebaked at 100° C. for 120 sec, and patterned. The patterning was performed with g-line (wavelength of 436 nm) exposure having a lighting intensity of 2100 mJ/cm$^2$ and an exposure time of 150 sec. The thickness of the resist film of the substrate was 20 μm with in-plane variation of ±1 μm by the measurement using a stylus film-thickness meter. The open-hole diameter was 20 μm.

A gold plated layer (a first bump layer) was formed in the open holes of the substrate. An electrolytic gold plating liquid (Temperex 209A available from Electroplating Engineers of Japan Limited) was used for the gold plating. The gold plated layer was formed to a height of 10 μm.

Subsequently, a gold metal paste was instilled onto the surface of the photoresist layer to fill the open holes with the gold paste by spin coating. The gold paste for use was prepared by blending gold powder having a purity of 99.99 wt % and an average particle diameter of 0.3 μm into organic solvent of ester alcohol (2,2,4-trimethyl-3-hydroxypentaisobutylate ($C_{12}H_{24}O_3$)). The paste was applied and then vacuum-dried at +5° C. in a drier.

After some redundant metal paste was removed with a blade, the semiconductor wafer was placed in an electric furnace for sintering the gold powder at a sintering temperature of 80° C. for 30 min. Then, the semiconductor wafer was immersed in acetone for peeling the resist and sintered once again at 230° C. for 30 min.

Figure 2:
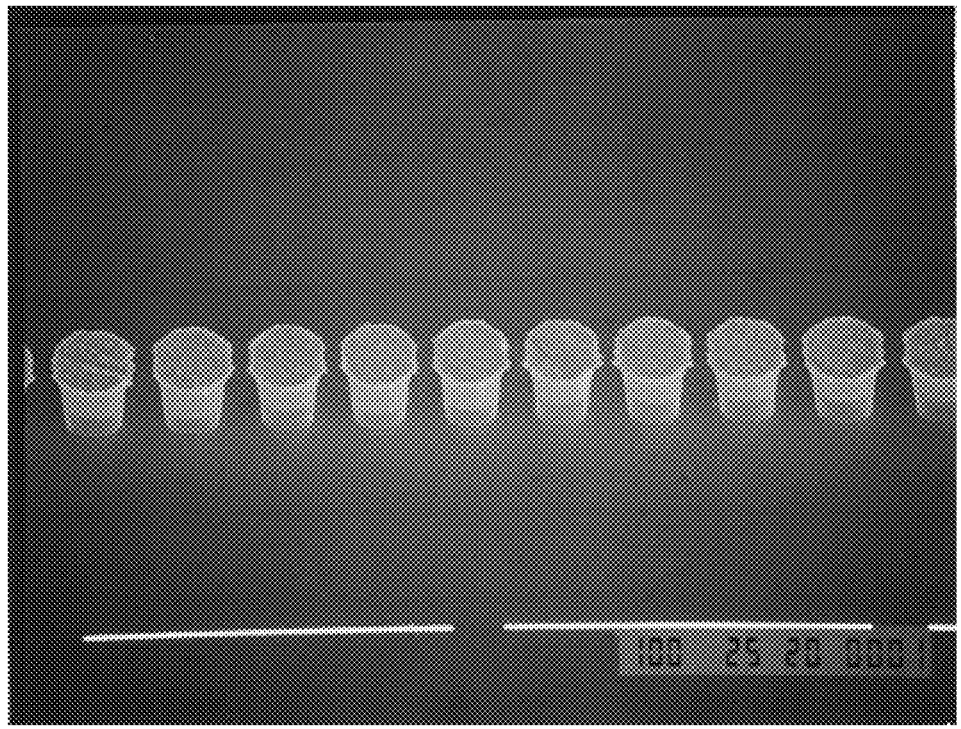
FIG. 2 is a SEM photograph showing an external view of bumps produced according to an embodiment of the present invention.
Figure 3:
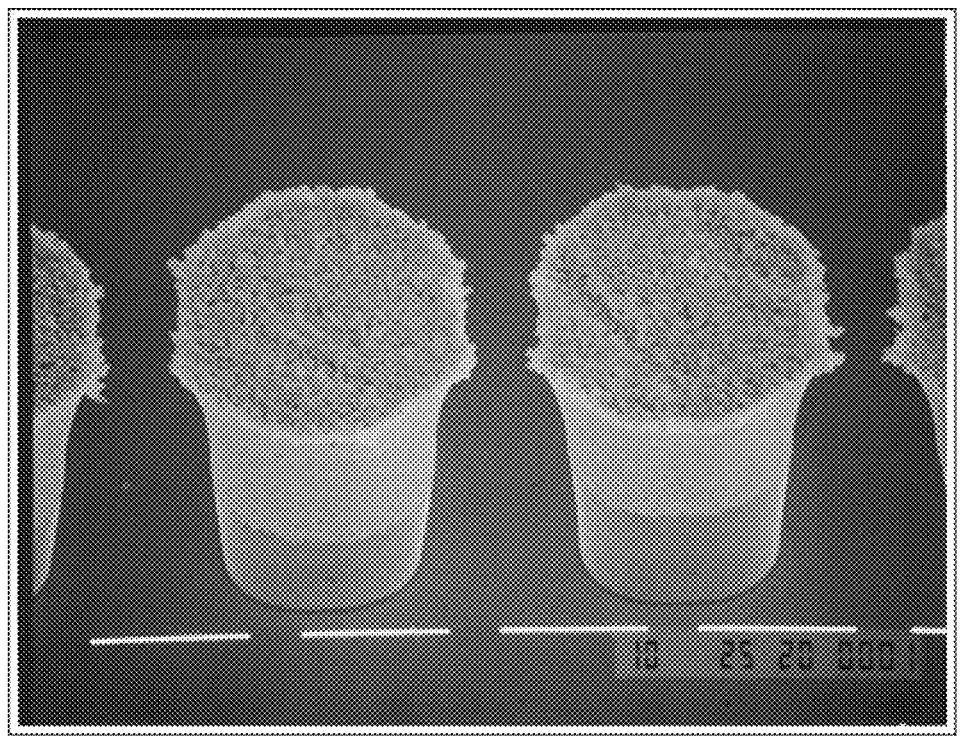
FIG. 3 is an enlarged SEM photograph showing an external view of bumps produced according to an embodiment of the present invention.

FIGS. 2 and 3 are SEM photographs showing an external view of bumps produced according to an embodiment of the present invention. As shown in the photographs, the bumps formed in the present example had a configuration of a gold plated layer (a first bump layer) capped with a powder-sintered body (a second bump layer), composing a neatly arranged shape without forming a bridge between the bumps.

Figure 4:
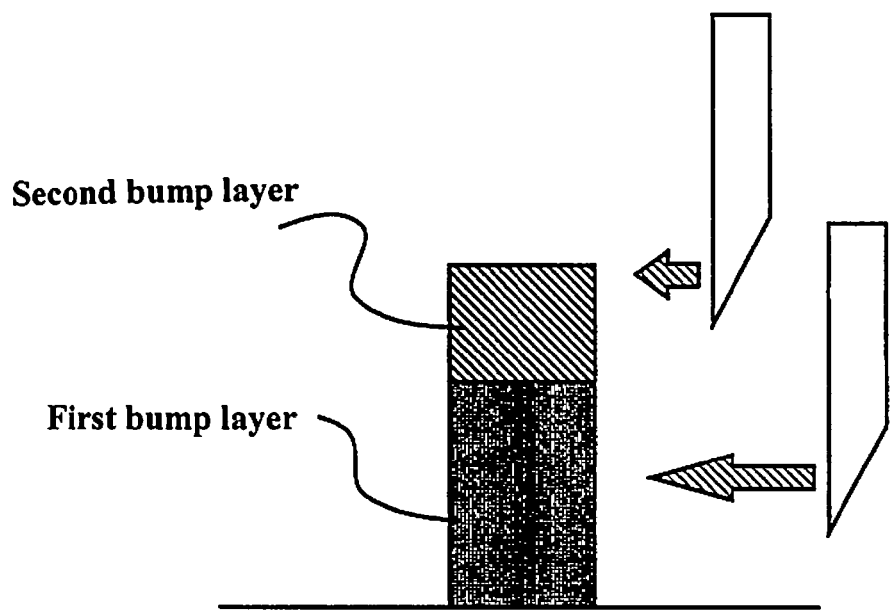
FIG. 4 is diagram illustrating a method for measuring Young's modulus of first and second bump layers.

Young's modulus was measured for each of the first bump layer and the second bump layer of the produced bumps. The measurement of Young's modulus was obtained from the slope of the linear portion of stress-strain curve in the shearing test performed as shown in FIG. 4.

A bonding test was performed using a silicon wafer having a bump pattern produced as described above. Using a glass substrate having a Ti film (0.5 μm) and a Au film (1.0 μm) formed by sputtering as an opposite substrate, the surface of the silicon wafer having the bumps was faced with the surface of the Au film of the opposite substrate for bonding to be examined. As heat and pressure load during bonding, the glass substrate was placed on a heating stage heated at 230° C. and pressurized at a pressure of 0.015 N per one bump for 10 min.

In the formation of the bumps and the bonding test described above, the first bump layer was gold plated and the second bump layer was gold sintered. In the present embodiments, the metals of the first and the second layers were changed in the same steps described above, and the sintering temperature of the second layer was adjusted for the formation of the bumps and the bonding test to examine the relation between the ratio of the Young's moduli of the both bump layers and bondability. The results are shown in Tables 3 to 7.

TABLE 3

| First bump layer | | Second bump layer | | Ratio of Young's moduli (second/first) | Bondability |
|---|---|---|---|---|---|
| Metal | Young's modulus | Metal (sintering temperature) | Young's modulus | | |
| Au | 80 GPa | Au (70° C.) | 10 GPa | 0.13 | o |
| Au | 80 GPa | Au (80° C.) | 11 GPa | 0.14 | o |
| Au | 80 GPa | Au (230° C.) | 12 GPa | 0.15 | o |
| Au | 80 GPa | Au (300° C.) | 25 GPa | 0.31 | o |
| Au | 80 GPa | Au (320° C.) | 45 GPa | 0.56 | x | o: Not deformed first bump layer. Not remarkably deformed second bump layer, achieving good bond.
x: Deformed first bump layer, causing entire bump to deform.

TABLE 4

| First bump layer | | Second bump layer | | Ratio of Young's moduli (second/first) | Bondability |
|---|---|---|---|---|---|
| Metal | Young's modulus | Metal (Sintering temperature) | Young's modulus | | |
| Cu | 110 GPa | Au (70° C.) | 10 GPa | 0.09 | x[*1] |
| Cu | 110 GPa | Au (80° C.) | 11 GPa | 0.10 | o |
| Cu | 110 GPa | Au (230° C.) | 12 GPa | 0.11 | o |
| Cu | 110 GPa | Au (300° C.) | 25 GPa | 0.22 | o |
| Cu | 110 GPa | Au (320° C.) | 45 GPa | 0.41 | x[*2] | o: Not deformed first bump layer. Not remarkably deformed second bump layer, achieving good bond.
x:
[*1](*1): Excessively laterally-deformed second layer, causing protruding bond.
[*2]Deformed first bump layer, causing entire bump to deform.

TABLE 5

| First bump layer | | Second bump layer | | Ratio of Young's moduli (second/first) | Bondability |
|---|---|---|---|---|---|
| Metal | Young's modulus | Metal (Sintering temperature) | Young's modulus | | |
| Ni | 120 GPa | Au (70° C.) | 10 GPa | 0.08 | x[*1] |
| Ni | 120 GPa | Au (90° C.) | 12 GPa | 0.1 | o |
| Ni | 120 GPa | Au (230° C.) | 12 GPa | 0.1 | o |
| Ni | 120 GPa | Au (300° C.) | 25 GPa | 0.21 | o |
| Ni | 120 GPa | Au (320° C.) | 45 GPa | 0.38 | o |
| Ni | 120 GPa | Au (340° C.) | 49 GPa | 0.41 | x[*2] | o: Not deformed first bump layer. Not remarkably deformed second bump layer, achieving good bond.
x:
[*1](*1): Excessively laterally-deformed second layer, causing protruding bond.
[*2]Deformed first bump layer, causing entire bump to deform.

TABLE 6

| First bump layer | | Second bump layer | | Ratio of Young's moduli (second/first) | Bondability |
|---|---|---|---|---|---|
| Metal | Young's modulus | Metal (Sintering temperature) | Young's modulus | | |
| Au | 80 GPa | Ag (70° C.) | 8 GPa | 0.1 | o |
| Au | 80 GPa | Ag (90° C.) | 13 GPa | 0.16 | o |
| Au | 80 GPa | Ag (230° C.) | 17 GPa | 0.21 | o |
| Au | 80 GPa | Ag (300° C.) | 27 GPa | 0.34 | o |
| Au | 80 GPa | Ag (320° C.) | 47 GPa | 0.58 | x | o: Not deformed first bump layer. Not remarkably deformed second bump layer, achieving good bond.
x: Deformed first bump layer, causing entire bump to deform.

TABLE 7

| First bump layer | | Second bump layer | | Ratio of Young's moduli (second/first) | Bondability |
|---|---|---|---|---|---|
| Metal | Young's modulus | Metal (Sintering temperature) | Young's modulus | | |
| Cu | 110 GPa | Ag (70° C.) | 8 GPa | 0.07 | x[*1] |
| Cu | 110 GPa | Ag (80° C.) | 12 GPa | 0.11 | o |
| Cu | 110 GPa | Ag (230° C.) | 17 GPa | 0.15 | o |
| Cu | 110 GPa | Ag (300° C.) | 27 GPa | 0.25 | o |
| Cu | 110 GPa | Ag (300° C.) | 47 GPa | 0.43 | x[*2] | o: Not deformed first bump layer. Not remarkably deformed second bump layer, achieving good bond.
x:
[*1](*1): Excessively laterally-deformed second layer, causing protruding bond.
[*2]Deformed first bump layer, causing entire bump to deform.

TABLE 8

| First bump layer | | Second bump layer | | Ratio of Young's moduli (second/first) | Bondability |
|---|---|---|---|---|---|
| Metal | Young's modulus | Metal (Sintering temperature) | Young's modulus | | |
| Ni | 120 GPa | Ag (70° C.) | 8 GPa | 0.07 | x[*1] |
| Ni | 120 GPa | Ag (90° C.) | 13 GPa | 0.11 | o |
| Ni | 120 GPa | Ag (230° C.) | 17 GPa | 0.14 | o |
| Ni | 120 GPa | Ag (300° C.) | 27 GPa | 0.23 | o |
| Ni | 120 GPa | Ag (320° C.) | 47 GPa | 0.39 | o |
| Ni | 120 GPa | Ag (340° C.) | 52 GPa | 0.43 | x[*2] | o: Not deformed first bump layer. Not remarkably deformed second bump layer, achieving good bond.
x:
[*1](*1): Excessively laterally-deformed second layer, causing protruding bond.
[*2]Deformed first bump layer, causing entire bump to deform.

The ratio of strength (Young's modulus) of the first and second bump layers is important for achieving good bondability in the combinations of various metals described above.

It was shown that the ratio of the Young's moduli is required to be in a range from 0.1 to 0.4 for the use of any metals. Since each of the bulk bodies of gold, copper, and nickel has different strength, preferably the sintering temperature range of the sintered body to compose the second bump layer is properly adjusted when any of these metals composes the first bump layer.

After the wafer was bonded by the flip chip method described above, the conduction between neighboring bump bonds was measured for confirming the bonding state (stability) of each bump at room temperature, resulting in an electrical resistance of 1.5±0.1Ω. For comparison with this, an entire bump was formed by gold plating as a conventional example for the evaluation of the same sort. Using the electrolytic gold plating solution as in the present embodiment for forming the bump, a metal layer was formed in the entire opening hole of the resist by adjusting the plating time. The resist was removed as in the present embodiment to form the bumps having a height of 20 μm±2 μm.

A bonding test as in the present embodiment was performed for the silicon wafer having the plated bumps. After bonding, the conduction between neighboring bump bonds was measured at room temperature, resulting in not all the terminals achieving the conduction. At the location where the conduction was achieved, the electrical resistance was 2.1±0.6Ω. Compared with the present embodiment, the comparative example was obviously inferior in conduction stability. More specifically, all the terminals achieved the conduction with low electrical resistance and small variations thereof in the present embodiment. It is believed that the difference was caused by the nonuniform bonding states of the bumps with variations in bump height regarding the substrate having the plated bumps in the comparative example. Enhancing the applied pressure during bonding as a possible measure to eliminate this may affect the substrate. It was shown from this comparison that the present invention enables bonding under low pressure, which was not sufficiently achieved with the conventional method.

INDUSTRIAL APPLICABILITY

The dual structure bump of the present invention enables elimination of problems caused by variations in bump height during bonding by a flip chip method. The method for mounting a substrate using the present invention is favorably used for producing various semiconductor circuits requiring high integration.

What is claimed is:

1. A method of producing bumps of a conductive metal formed in a predetermined pattern on a substrate, the bump comprising:
a two-layer structure of a first bump layer of a bulk body of a first conductive metal, which is any of gold, copper, and nickel, formed on the substrate and a second bump layer of a sintered body of a powder of a second conductive metal, which is either gold or silver, formed on the first bump layer; the bulk body composing the first bump layer being formed through any of plating, sputtering, and CVD; the sintered body composing the second bump layer being formed by sintering a metal powder of the second conductive metal having a purity of not lower than 99.9 wt % and an average particle diameter of 0.005 μm to 1.0 μm; and the second bump layer having a Young's modulus 0.1 to 0.4 times that of the first bump layer; the method comprising the steps of:
forming the first bump layer on the substrate through any of plating, sputtering, and CVD; and forming the second bump layer by applying a metal paste containing a powder of the second conductive metal having a purity of not lower than 99.9 wt % and an average particle diameter of 0.005 μm to 1.0 μm onto the first bump layer, drying the metal paste, and then heating the metal paste at a sintering temperature of 70° C. to 320° C. for sintering.

2. The method according to claim 1, wherein the first bump layer has a height ratio of 0.1 to 0.9 based on the entire bump.

3. The method according to claim 1, wherein the first conductive metal and the second conductive metal are metals dissimilar to each other and at least one bulk intermediate layer is disposed between the first bump layer and the second bump layer for enhancing adhesion.

4. The method according to claim 2, wherein the first conductive metal and the second conductive metal are metals dissimilar to each other and at least one bulk intermediate layer is disposed between the first bump layer and the second bump layer for enhancing adhesion.

5. The method according to claim 3, wherein at least a surface of the intermediate layer in contact with the second bump layer is formed of the same conductive metal as the second conductive metal.

6. The method according to claim 4, wherein at least a surface of the intermediate layer in contact with the second bump layer is formed of the same conductive metal as the second conductive metal.

7. The method for producing bumps according to claim 1, wherein after the first bump layer is formed, a step of forming an intermediate layer is included at least once.

8. The method for producing bumps according to claim 2, wherein after the first bump layer is formed, a step of forming an intermediate layer is included at least once.

9. A method for mounting a substrate having bumps on an opposed substrate through a flip chip method, comprising bonding the bumps produced according to claim 1 with pressure applied from one or both directions to the substrate while heating at least the second bump layer.

10. A method for mounting a substrate having bumps on an opposed substrate through a flip chip method, comprising bonding the bumps produced according to claim 2 with pressure applied from one or both directions to the substrate while heating at least the second bump layer.

11. A method for mounting a substrate having bumps on an opposed substrate through a flip chip method, comprising bonding the bumps produced according to claim 3 with pressure applied from one or both directions to the substrate while heating at least the second bump layer.

12. A method for mounting a substrate having bumps on an opposed substrate through a flip chip method, comprising bonding the bumps produced according to claim 4 with pressure applied from one or both directions to the substrate while heating at least the second bump layer.

13. A method for mounting a substrate having bumps on an opposed substrate through a flip chip method, comprising bonding the bumps produced according to claim 5 with pressure applied from one or both directions to the substrate while heating at least the second bump layer.

14. A method for mounting a substrate having bumps on an opposed substrate through a flip chip method, comprising bonding the bumps produced according to claim 6 with pressure applied from one or both directions to the substrate while heating at least the second bump layer.

15. A method for mounting a substrate having bumps on an opposed substrate through a flip chip method, comprising bonding the bumps produced according to claim 7 with pressure applied from one or both directions to the substrate while heating at least the second bump layer.

16. A method for mounting a substrate having bumps on an opposed substrate through a flip chip method, comprising bonding the bumps produced according to claim 8 with pressure applied from one or both directions to the substrate while heating at least the second bump layer.

17. The method according to claim 9 wherein a heating temperature during the bonding is 70° C. to 300° C.

18. The method according to claim 10 wherein a heating temperature during the bonding is 70° C. to 300° C.

19. The method according to claim 11 wherein a heating temperature during the bonding is 70° C. to 300° C.

20. The method according to claim 9, wherein at least the second bump layer is pressurized by application of ultrasonic waves.

* * * * *